United States Patent
Barthel

(10) Patent No.: US 11,639,948 B2
(45) Date of Patent: May 2, 2023

(54) SIGNAL ANALYSIS METHOD AND MEASUREMENT SYSTEM

(71) Applicant: Rohde & Schwarz GmbH & Co. KG, Munich (DE)

(72) Inventor: Sven Barthel, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 486 days.

(21) Appl. No.: 16/850,458

(22) Filed: Apr. 16, 2020

(65) Prior Publication Data
US 2021/0325431 A1    Oct. 21, 2021

(51) Int. Cl.
*G01R 13/02* (2006.01)

(52) U.S. Cl.
CPC .................. *G01R 13/0218* (2013.01)

(58) Field of Classification Search
CPC .................................................. G01R 13/0218
See application file for complete search history.

(56) References Cited

U.S. PATENT DOCUMENTS

| 5,633,801 A | * | 5/1997 | Bottman | ................ | G01R 27/02 702/65 |
| 2014/0267009 A1 | * | 9/2014 | DeLean | ................ | G06V 40/28 345/156 |

FOREIGN PATENT DOCUMENTS

JP        2006292499 A   * 10/2006

* cited by examiner

*Primary Examiner* — Huy Q Phan
*Assistant Examiner* — Adam S Clarke
(74) *Attorney, Agent, or Firm* — Christensen O'Connor Johnson Kindness PLLC

(57) ABSTRACT

A signal analysis method is described. The signal analysis method comprises the following steps. An output signal is received from a device under test. A sampling point density is received and/or the sampling point density is determined based on the output signal. A response function of the device under test is determined based on the output signal and based on the sampling point density. The sampling point density represents a number of sampling points per frequency interval for determining the response function. The response function characterizes at least one property of the device under test as a function of frequency. Moreover a measurement system for determining a response function of a device under test is described.

16 Claims, 2 Drawing Sheets

SIGNAL ANALYSIS METHOD AND MEASUREMENT SYSTEM

FIELD OF THE DISCLOSURE

Embodiments of the present disclosure generally relate to a signal analysis method. Embodiments of the present disclosure further relate to a measurement system for determining a response function of a device under test.

BACKGROUND

One common type of measurement for evaluating the performance of a device under test is to measure a response of the device under test to an input signal. For example, the device under test is consecutively supplied with input signals having different frequencies from each other, and the respective response of the device under test to the input signals is measured.

In the state of the art, it is common to generate the input signals with a fixed number of different frequencies per frequency decade such that there is an even distribution of sampling points in a logarithmic plot of the response function.

However, this approach is not always optimal because all portions of the response function are analyzed with a constant resolution regardless of the response properties of the device under test.

Accordingly, there is a need for a signal analysis method as well as for a measurement system that allow a more sophisticated analysis of a response of a device under test to an input signal.

SUMMARY

Embodiments of the present disclosure provide a signal analysis method. In an embodiment, an output signal is received from a device under test. A sampling point density is received and/or the sampling point density is determined based on the output signal. A response function of the device under test is determined based on the output signal and based on the sampling point density. The sampling point density represents a number of sampling points per frequency interval for determining the response function. The response function characterizes at least one property of the device under test as a function of frequency.

Embodiments of the present disclosure further provide a measurement system for determining a response function of a device under test. In an embodiment, the measurement system comprises an input and a signal processing circuit or module. The input is configured to receive an output signal of a device under test. The signal processing module is configured to at least one of receive a sampling point density or determine the sampling point density based on the output signal. The signal processing module further is configured to determine a response function of the device under test based on the output signal and based on the sampling point density. The sampling point density represents a number of sampling points per frequency interval for determining the response function, wherein the response function characterizes at least one property of the device under test as a function of frequency.

In other words, the sampling point density is a function of frequency representing the density of sampling/measurement points in frequency domain.

The response function may relate to the ratio of an output signal and an input signal of the device under test. The input signal may also be called stimulus (signal) that is generated by a measurement instrument and forwarded to the device under test. In addition, the measurement instrument receives via its input the output signal of the device under test for further processing.

In general, the output signal received from the device under test is sampled by the measurement instrument based on the sampling point density.

The input signal that is provided at a respective input of the device under test may be received appropriately such that any influences of the measurement instrument connected to the device under test can be excluded. The measurement instrument provides the respective input signal that is forwarded to the device under test for being processed by the device under test appropriately.

The device under test processes the input signal and outputs a processed version of the input signal via its output that is received by the measurement instrument.

Furthermore, the input signal that is forwarded to the device under test, for example to the input of the device under test, is taken into consideration by the measurement instrument, for example the signal processing module, in order to determine the response function.

In some embodiments, the measurement instrument comprises an internal directional coupler or power splitter which couples a defined amount of electromagnetic power in a transmission line associated with the input of the device under test to a port assigned to the signal processing module. Since the input of the measurement instrument is also assigned to the signal processing module, the output signal of the device under test is also forwarded to the signal processing module. Accordingly, the ratio of the output signal and the input signal can be determined, namely the response function.

The present disclosure is based on the idea to first identify particularly relevant and/or interesting portions of the output signal or rather a (preliminary) response function and to adapt the sampling point density such that these relevant and/or interesting portions are analyzed with a higher resolution than other portions of the output signal or rather a (preliminary) response function.

Thus, the determined response function has a higher resolution in relevant and/or interesting portions.

For example, relevant and/or interesting portions may be portions where the respective value varies strongly and/or where a strong curvature occurs.

Therein, the relevant and/or interesting portions may be automatically recognized, e.g., the sampling point density is determined automatically. In some embodiments, the automatic recognition of the relevant and/or interesting portions and/or the automatic determination of the sampling point density is done by the signal processing module.

Alternatively or additionally, a user may choose portions of the output signal or rather a (preliminary) response function that are to be analyzed with a higher resolution, and a corresponding sampling point density may be generated automatically that is used to determine the response function. For example, the generated sampling point density may have a Gaussian shape. In another example, the generated sampling point density may just have a higher measurement point density, for example the density of measurement points is doubled or tripled compared to other portions of the output signal or rather the (preliminary) response function.

Of course, the sampling point density may also be directly set by the user, such that the sampling point density is received.

In addition, the sampling point density may be predefined by a manufacturer as a setting of the measurement instrument. However, the setting may be adapted by the user. For instance, it might be predefined that the sampling point density is doubled or tripled compared to other portions or compared to a preliminary sampling point density used when determining the (preliminary) response function.

In some embodiments, the measurement system is configured to perform the signal analysis method described above.

Regarding the further properties and advantages of the measurement system, reference is made to the explanations given above regarding the signal analysis method, which also hold for the measurement system and vice versa.

According to an aspect of the present disclosure, the response function is established as a frequency response, an amplitude response, a phase response or a transfer function. These are the relevant types of functions that characterize one, several or even all aspects of the response of the device under test to an input signal.

According to another aspect of the present disclosure, a preliminary response function is determined based on a predefined preliminary sampling point density. In other words, in a first iteration, a predefined sampling rate (in the sense of samples per frequency interval) is used for determining the preliminary response function. Thus, the first iteration may be equal to analysis methods known in the state of the art. In a second iteration, the sampling point density is adapted based on the preliminary response function such that relevant and/or interesting portions of the output signal or rather the preliminary response function determined in the first iteration are analyzed with a higher resolution in the second iteration.

Therein, the preliminary response function is a ratio of the output signal and the (initial) input signal, wherein the output signal is sampled by the measurement instrument based on the preliminary sampling point density.

In some embodiments, the predefined preliminary sampling point density is constant. Therein, the term "constant" may refer to a logarithmic scale, such that the sampling points corresponding to the preliminary sampling point density are evenly distributed along a logarithmically scaled frequency axis.

In a further embodiment of the present disclosure, a first derivative of the preliminary response function is determined, wherein the sampling point density is determined based on the first derivative. The first derivative is indicative of a rate of change of the preliminary response function. Thus, the sampling point density may be determined such that a higher (absolute) value of the first derivative is associated with a higher value of the sampling point density.

In other words, the portions that are of particular relevance and/or interest are identified based on the first derivative of the preliminary response function.

According to another aspect of the present disclosure, an absolute value of the first derivative is determined, wherein the sampling point density is determined based on the absolute value of the first derivative. Accordingly, the portions of that are of particular relevance and/or interest are identified based on the absolute rate of change of the preliminary response function.

In a further embodiment of the present disclosure, the first derivative is compared with at least one predefined reference function in order to determine the sampling point density. More precisely, the value of the sampling point density may be adapted based on whether the (absolute) value of the first derivative is above or below the predefined reference function.

In some embodiments, the predefined reference function may be constant. In other words, the predefined reference function defines a threshold, and the value of the sampling point density may be adapted based on whether the (absolute) value of the first derivative is above or below the threshold.

Accordingly, the sampling point density may have one of two different values, depending on whether or not the threshold is met. Thus, the sampling point density may be a binary function.

However, several predefined reference functions may be provided that define different thresholds. Accordingly, the sampling point density may have one of several different values, depending on which of the thresholds are met or not met.

According to an aspect of the present disclosure, a second derivative of the preliminary response function is determined, wherein the sampling point density is determined based on the second derivative.

The second derivative is indicative of a curvature of the preliminary response function. Thus, the sampling point density may be determined such that a higher (absolute) value of the second derivative is associated with a higher value of the sampling point density.

In other words, the portions that are of particular relevance and/or interest are identified based on the second derivative of the preliminary response function.

According to another aspect of the present disclosure, an absolute value of the second derivative is determined, wherein the sampling point density is determined based on the absolute value of the second derivative. Thus, the portions that are of particular relevance and/or interest are identified based on the absolute curvature of the preliminary response function.

In a further embodiment of the present disclosure, the second derivative is compared with at least one predefined reference function in order to determine the sampling point density. More precisely, the value of the sampling point density may be adapted based on whether the (absolute) value of the second derivative is above or below the predefined reference function.

In some embodiments, the predefined reference function may be constant. In other words, the predefined reference function defines a threshold, and the value of the sampling point density may be adapted based on whether the (absolute) value of the second derivative is above or below the threshold.

Accordingly, the sampling point density may have one of two different values, depending on whether or not the threshold is met by the second derivative. Thus, the sampling point density may be a binary function.

However, several predefined reference functions may be provided that define different thresholds. Accordingly, the sampling point density may have one of several different values, depending on which of the thresholds are met or not met by the second derivative.

Of course, the sampling point density may be determined based on both the first derivative and the second derivative. For example, at least one reference function may be provided for each of the first derivative and the second derivative, and the value of the sampling point density may be adapted based on whether the (absolute) value of the first derivative is above or below the value of the corresponding reference function and based on whether the (absolute) value of the second derivative is above or below the value of the corresponding reference function.

According to an aspect of the present disclosure, an input signal for the device under test is generated via a signal generator based on the sampling point density.

In some embodiments, a frequency increment of the input signal is determined based on the sampling point density. In other words, the frequency content of the input signal and/or the frequency difference of two consecutive input signals is adjusted based on the sampling point density, for example compared to the preliminary sampling point density.

Generally, a higher sampling point density corresponds to a smaller frequency increment.

The signal processing module and/or the input may be part of a measurement instrument, e.g. of an oscilloscope or of a vector network analyzer.

The measurement system may comprise a signal generator being configured to generate an input signal for the device under test based on the sampling point density.

In some embodiments, the signal generator may be part of the same measurement instrument as the input and/or the signal processing module. Thus, a highly integrated measurement system is provided.

According to an aspect of the present disclosure, the signal generator is configured to determine a frequency increment of the input signal based on the sampling point density. In other words, the frequency content of the input signal and/or the frequency difference of two consecutive input signals is adjusted by the signal generator based on the sampling point density. Generally, a higher sampling point density corresponds to a smaller frequency increment.

According to another aspect of the present disclosure, the response function is established as a frequency response, an amplitude response, a phase response or a transfer function.

The signal processing module may be configured to determine a preliminary response function based on a predefined preliminary sampling point density. In other words, the signal processing module is configured to perform two iterations. In a first iteration, a predefined sampling rate (in the sense of samples per frequency interval) is used for determining the preliminary response function. In a second iteration, the sampling point density is adapted based on the preliminary response function such that relevant and/or interesting portions are analyzed with a higher resolution in the second iteration.

According to another aspect of the present disclosure, the signal processing module is configured to determine at least one of a first derivative of the preliminary response function and a second derivative of the preliminary response function, wherein the signal processing module is configured to determine the sampling point density based on at least one of the first derivative and the second derivative. Thus, the signal processing module may be configured to determine the sampling point density such that a higher (absolute) value of the first derivative and/or the second derivative is associated with a higher value of the sampling point density.

In a further embodiment of the present disclosure, the signal processing module is configured to determine at least one of an absolute value of the first derivative and an absolute value of the second derivative, wherein the signal processing module is configured to determine the sampling point density based on at least one of the absolute value of the first derivative and the absolute value of the second derivative. Accordingly, the signal processing module is configured to identify portions that are of particular relevance and/or interest based on the absolute rate of change of the preliminary response function and/or based on an absolute curvature of the preliminary response function.

In some embodiments, the signal processing module is configured to compare at least one of the first derivative and the second derivative with at least one predefined reference function in order to determine the sampling point density. More precisely, the value of the signal processing module may be configured to adapt the sampling point density based on whether the (absolute) value of the first derivative and/or the (absolute) value of the second derivative is above or below the respectively corresponding predefined reference function.

In some embodiments, only the relevant and/or interesting portions are used during the second iteration which uses the sampling point density such that only these relevant and/or interesting portions are analyzed with the higher resolution in the second measurement iteration. The other portions have already been analyzed during the first iteration with the preliminary sampling point density that is lower than the sampling point density used for the second iteration.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
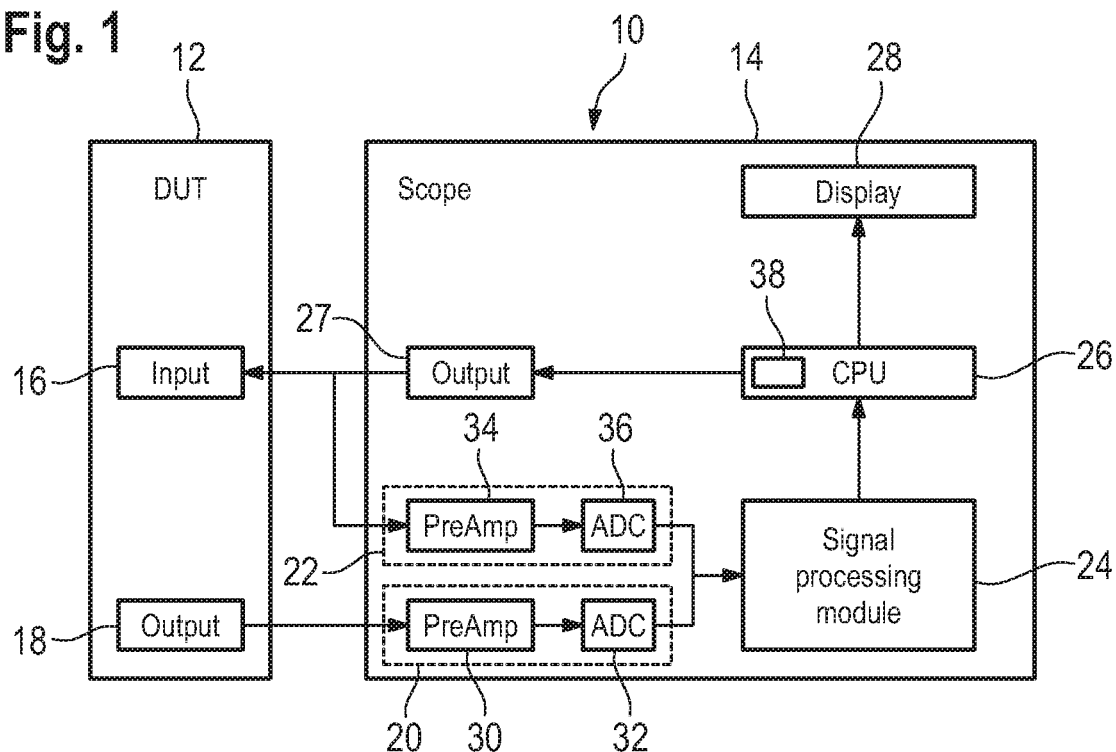
FIG. 1 schematically shows a measurement system according to an embodiment of the disclosure.

FIG. 1 shows a schematic block diagram of a measurement system 10 comprising a device under test 12 and a measurement instrument 14. In the example of FIG. 1, the measurement instrument 14 is established as an oscilloscope (denoted by "Scope" in FIG. 1). However, it is to be understood that the measurement instrument 14 may be established as any other kind of suitable measurement instrument, e.g. as a vector network analyzer.

The device under test 12 comprises an input 16 and an output 18 that relate to respective (hardware) interfaces of the device under test 12. Generally, the device under test 12 is established as an electronic device that is configured to receive an input signal via the input 16. The device under test 12 processes the input signal and generates a corresponding output signal, which is then transmitted via the output 18.

The measurement instrument 14 comprises an input 20 that is connected with the output 18 of the device under test 12 such that the output signal of the device under test 12 is received by the measurement instrument 14 for further processing. In addition, the measurement instrument 14 comprises a second input 22 that is associated with the input 16 of the device under test 12, for example the input signal forwarded to the input 16 as will be described later in more detail.

The measurement instrument 14 also comprises a signal processing circuit or module 24, a computing circuit or module 26 (which is denoted by "CPU" in FIG. 1) and an output 27 that is also associated with the input 16 of the device under test 12. The measurement instrument 14 forwards the input signal to the input 16 of the device under test 12 via the output 27, wherein the input signal is processed internally by the device under test 12 and outputted via its output 18 as already described above. The measurement instrument 14 may optionally comprise a display 28.

In the embodiment shown, the first input 20 comprises a first amplifier 30 and a first analog to digital converter 32 ("ADC" in the following). The first ADC 32 is used for sampling the output signal of the device under test 12 that is received via the first input 20. The first input 20 of the measurement instrument 14 is connected to the output 18 of the device under test 12 in a signal transmitting manner. Therein and in the following, the term "connected in a signal transmitting manner" is understood to denote all suitable wire-based and wireless connections, for example an electrical connection via cable.

In embodiment shown, the second input 22 comprises a second amplifier 34 and a second ADC 36. The second ADC 36 is used for sampling the input signal forwarded to the device under test 12 that may received via the second input 22. The second input 22 and the output 27 of the measurement instrument 14 are each connected to the input 16 of the device under test 12 in a signal transmitting manner.

In general, the second input 22 may be located at an outer side of the measurement instrument 14 such that the second input 22 is established by a respective interface. Alternatively, the second input 22 may be an internal one that is connected with a port of an internal power divider or rather an internal directional coupler which is associated with the output 27 of the measurement instrument 14.

The amplifiers 30, 34 as well as the ADCs 32, 36 are operated in a similar manner, ensuring that the input signal as well as the output signal are processed in a similar manner. Accordingly, the input signal and the output signal can be compared in an improved manner.

In any case, the second input 22 ensures that the input signal forwarded to the device under test 12, for example its input 16, can be gathered for internal analysis by the signal processing module 24.

Accordingly, the inputs 20, 22 of the measurement instrument 14 are each connected to the signal processing module 24 upstream of the signal processing module 24. Therein and in the following, the terms "upstream" and "downstream" denote the signal propagation direction within the measurement system 10, wherein signals propagate from the upstream component to the downstream component.

The computing module 26 is connected to the signal processing module 24 downstream of the signal processing module 24. The computing module 26 further comprises a signal generator 38, which therefore is connected to the signal processing module 24.

The output 27 of the measurement instrument 14 and the display 28 are each connected to the computing module 26 downstream of the computing module 26.

Figure 2:
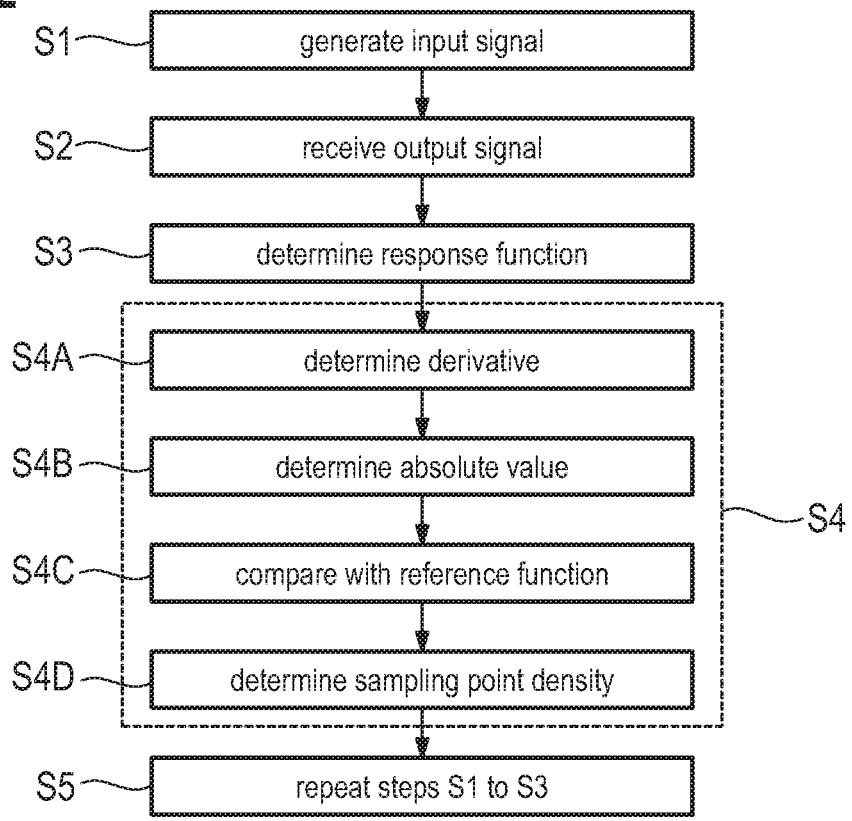
FIG. 2 shows a flow chart of a signal analysis method according to an embodiment of the disclosure.

The measurement system 10 is configured to perform, for example, a signal analysis method that is described in the following with reference to FIG. 2.

At least one input signal is generated for the device under test 12 via the signal generator 38 and is forwarded to the input 16 of the device under test 12 via the output 27 of the measurement instrument 14 (step S1). Herein, the at least one input signal may be generated, for example, based on a predefined preliminary sampling point density. The predefined preliminary sampling point density may be set by a user or predefined by the measurement instrument 14.

In any case, the predefined preliminary sampling point density determines a frequency increment of the at least one input signal generated by the signal generator 38. In other words, the frequency content of the at least one input signal and/or the frequency difference of two consecutive input signals is adjusted based on the predefined preliminary sampling point density. In some embodiments, the predefined preliminary sampling point density is constant. Therein, the term "constant" may refer to a logarithmic scale, such that the sampling points corresponding to the preliminary sampling point density are evenly distributed along a logarithmically scaled frequency axis.

The input signal generated and forwarded to the device under test 12 is also received via the second input 22 for an internal analysis as will be described in more detail later. Moreover, the device under test 12 processes the at least one input signal and output a processed version of the input signal via the output 18 (step S2). This output signal is received by the measurement instrument 14 via the first input 20.

The at least one received output signal received via the first input 20 as well as the input signal received via the second input 22 are amplified by the corresponding one of the amplifiers 30, 34 and digitized by the corresponding one of the ADCs 32, 36. In some embodiments, the amplifiers 30, 34 and the ADCs 32, 36 operate in a similar manner such that the input signal (internally) received and the output signal are processed in a similar manner prior to their processing by the signal processing module 24 that is located downstream of the amplifiers 30, 34 and the ADCs 32, 36.

A preliminary response function of the device under test 12 is determined via the signal processing module 24 based on the at least one output signal as well as the (internally) received input signal (step S3). The preliminary response function corresponds to a ratio of the at least one output signal and the at least one input signal, wherein the number of sampling points per frequency interval is determined by the preliminary sampling point density.

In some embodiments, the ADCs 32, 36 use the respective preliminary sampling point density for sampling purposes. Put differently, the number of samples associated with the input signal and the output signal is determined by the ADCs 32, 36 processing the respective signal(s).

The determined preliminary response function may be a preliminary frequency response, a preliminary amplitude response, a preliminary phase response or a preliminary transfer function. Optionally, the preliminary response function may be displayed on the display 28, such that a user can observe the preliminary response function.

A sampling point density is determined via the signal processing module 24 based on the preliminary response function (step S4). Generally speaking, in step S4 the signal processing module 24 identifies particularly relevant and/or interesting portions of the preliminary response function or rather the output signal. The signal processing module 24 then adapts the sampling point density such that these relevant and/or interesting portions are analyzed with a higher resolution than other portions in a second measurement iteration, which is described in more detail below. For this purpose, the signal processing module 24 may control the ADCs 32, 36 appropriately.

Figure 3A:
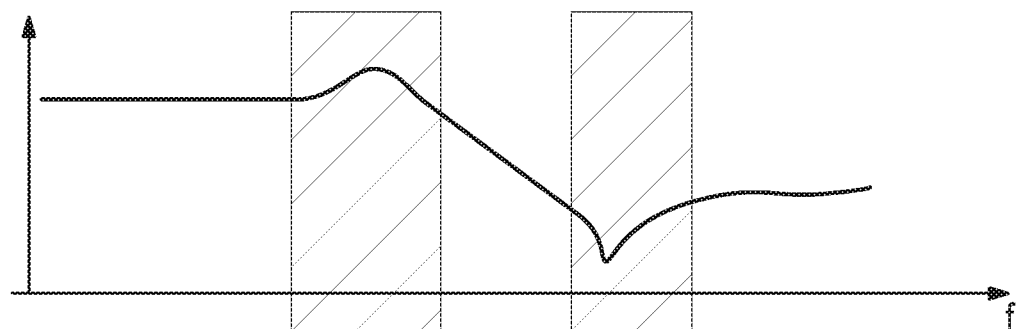
FIGS. 3A and 3B show a diagram of a response function of a device under test and a diagram of a corresponding sampling point density plotted against frequency, respectively.
Figure 3B:
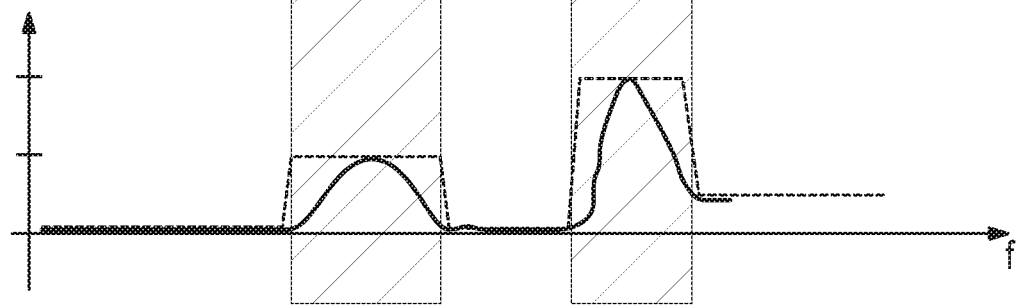

Step S4 is illustrated in FIGS. 3A and 3B. FIG. 3A shows an exemplary response function of the device under test 12 plotted against frequency f. As can clearly be seen, portions are provided where merely changes occur, namely the portions to the left and to the right of the shaded areas. Moreover, a portion is provided where changes with a constant slope occur, namely the portion between the two shaded areas. For these areas, a lower sampling point density is sufficient, as is reflected in the exemplary plot of the sampling point density in FIG. 3B. In contrast, portions that have a strong curvature and/or slope, i.e. the shaded areas, are associated with a higher sampling point density as these portions are of higher interest.

Figure 4A:
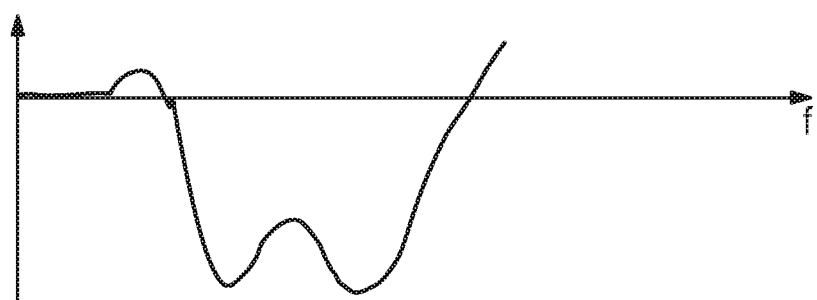
FIGS. 4A-4C show illustrations of individual steps of the signal analysis method of FIG. 2.

Step S4 is explained in more detail in the following with reference to FIGS. 4A-4C. As is illustrated in FIG. 4A, the signal processing module 24 determines a first derivative of the preliminary response function (step S4A). Of course, the first derivative is indicative of a rate of change of the preliminary response function. A second derivative of the preliminary response function may be also determined. The second derivative is indicative of a curvature of the preliminary response function.

Figure 4B:
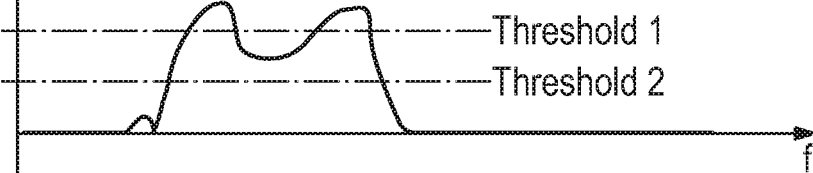

Further, as illustrated in FIG. 4B, the signal processing module 24 determines an absolute value of the first derivative of the preliminary response function (step S4B). Additionally, an absolute value of the second derivative of the preliminary response function may be determined.

The resulting absolute value of the first derivative is compared with at least one predefined reference function (step S4C). In the exemplary embodiment of FIG. 4B, there are two constant predefined reference functions denoted by "Threshold 1" and "Threshold 2". More precisely, it is determined whether the absolute value of the first derivative is above or below the value of the respective reference function. Additionally, the absolute value of the second derivative of the preliminary response function may be compared with at least one reference function as well, analogously to the case of the first derivative.

Based on the comparison with the at least one reference function, the sampling point density is determined (step S4D). The resulting sampling point density is shown in FIG. 4C.

Figure 4C:
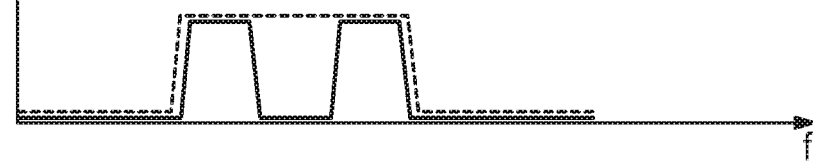

The dashed line in FIG. 4C shows the resulting sampling point density if only the absolute value of the first derivative is compared with the at least one reference function. As can be seen, all portions having at least a certain predefined slope are associated with a higher value of the sampling point density.

The solid line in FIG. 4D shows the resulting sampling point density if both the absolute value of the first derivative and of the second derivative are compared with at least one predefined reference function, respectively. There, also portions having an approximately constant slope exceeding the predefined slope are associated with a lower sampling point density.

Accordingly, in the shown example, the sampling point density may have one of two different values, depending on whether or not the respective thresholds are met. Thus, the sampling point density may be a binary function.

However, several predefined reference functions may be provided that define different thresholds. Accordingly, the sampling point density may have one of several different values, depending on which of the thresholds are met or not met.

The determined sampling point density is forwarded to the computing module 26, for example to the signal generator 38.

The steps S1 to S3 described above are then repeated, but instead of the preliminary sampling point density, the determined sampling point density is used (step S5). As a result of step S5, a response function is determined, wherein the resolution of the response function is higher in the identified relevant and/or interesting portions. In other words, the interesting and/or relevant portions are analyzed with a higher resolution in a second iteration of steps S1 to S3.

For the second iteration, the ADCs 32, 36 may also be operated by a different sampling rate, for example a time-dependent sampling rate, which is based on the sampling point density determined as described above.

Summarizing, in the first iteration of steps S1 to S3, a predefined sampling rate (in the sense of samples per frequency interval) is used for determining the preliminary response function. Thus, the first iteration may be equal to analysis methods known in the state of the art.

In a second iteration of steps S1 to S3, the sampling point density is adapted based on the preliminary response function, and the response function is determined based on the adapted sampling point density. Thus, relevant and/or interesting portions are analyzed with a higher resolution in the second iteration.

Accordingly, the sampling point density may vary over time as only the relevant and/or interesting portions are analyzed with a higher resolution compared to the other portions that may be analyzed with a lower resolution, for instance the one of the first iteration. Hence, a dynamic sampling point density is provided for the second iteration rather than a static one for the first iteration.

In the signal analysis method described above, the relevant and/or particularly interesting portions are identified automatically by the signal processing module 24, for example by the processing described with reference to step S4.

Alternatively or additionally, a user may choose portions (of the output signal or the preliminary frequency response) that are to be analyzed with a higher resolution, for instance by selecting or rather marking a respective area on the display 28. For this purpose, the display 28 may be a touch-sensitive display 28, namely a so-called touchscreen.

Afterwards, a corresponding sampling point density may be generated automatically by the measurement instrument 14.

For example, the generated sampling point density may have a Gaussian shape for the signal portions selected by the user. In another example, the generated sampling point density may just have a higher measurement point density, for example the density of measurement points is doubled or tripled compared to other portions or rather compared to the preliminary sampling point density used in the first iteration. Of course, the sampling point density may also be directly set by the user via a user interface, for instance the touch-sensitive display 28.

In any case, the present disclosure ensures that the relevant and/or particularly interesting portions can be analyzed with a higher accuracy compared to other portions such that the overall time required for analysis can be reduced as non-interesting portions can be processed in a fast manner (with less accuracy).

Depending on the device under test, different properties may be characterized due to the response function, for instance a property associated with gain or loss. In some embodiments, the gain or loss provided by the device under test when processing a signal can be characterized as a function of frequency.

Certain embodiments disclosed herein utilize circuitry (e.g., one or more circuits) in order to implement standards, protocols, methodologies or technologies disclosed herein, operably couple two or more components, generate signals or information, process signals or information, analyze signals or information, encode/decode signals or information, convert signals or information, transmit and/or receive signals or information, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analysis method, said signal analysis method comprising:
   receiving an output signal from a device under test;
   at least one of receiving a sampling point density or determining said sampling point density based on said output signal; and
   determining a response function of said device under test based on said output signal and based on said sampling point density,
   wherein said sampling point density represents a number of sampling points per frequency interval for determining said response function, and wherein said response function characterizes at least one property of said device under test as a function of frequency,
   wherein a preliminary response function is determined based on a predefined preliminary sampling point density,
   wherein at least one of a first derivative of said preliminary response function and a second derivative of said preliminary response function is determined, and
   wherein said sampling point density is determined based on at least one of said first derivative and said second derivative.

2. The signal analysis method of claim 1, wherein said response function is established as a frequency response, an amplitude response, a phase response or a transfer function.

3. The signal analysis method of claim 1, wherein said predefined preliminary sampling point density is constant.

4. The signal analysis method of claim 1, wherein an absolute value of said first derivative is determined, and wherein said sampling point density is determined based on said absolute value of said first derivative.

5. The signal analysis method of claim 1, wherein said first derivative is compared with at least one predefined reference function in order to determine said sampling point density.

6. The signal analysis method of claim 1, wherein an absolute value of said second derivative is determined, and wherein said sampling point density is determined based on said absolute value of said second derivative.

7. The signal analysis method of claim 1, wherein said second derivative is compared with at least one predefined reference function in order to determine said sampling point density.

8. The signal analysis method of claim 1, wherein an input signal for said device under test is generated via a signal generator based on said sampling point density.

9. The signal analysis method of claim 8, wherein a frequency increment of said input signal is determined based on said sampling point density.

10. A measurement system for determining a response function of a device under test, said measurement system comprising an input and a signal processing circuit,
    said input being configured to receive an output signal of a device under test,
    said signal processing circuit being configured to:

at least one of receive a sampling point density or determine said sampling point density based on said output signal, and determine a response function of said device under test based on said output signal and based on said sampling point density, wherein said sampling point density represents a number of sampling points per frequency interval for determining said response function, and wherein said response function characterizes at least one property of said device under test as a function of frequency, wherein said signal processing circuit is configured to determine a preliminary response function based on a predefined preliminary sampling point density, wherein said signal processing circuit is configured to determine at least one of a first derivative of said preliminary response function and a second derivative of said preliminary response function, and wherein said signal processing circuit is configured to determine said sampling point density based on at least one of said first derivative and said second derivative.

11. The measurement system of claim 10, further comprising a signal generator being configured to generate an input signal for said device under test based on said sampling point density.

12. The measurement system of claim 11, wherein said signal generator is configured to determine a frequency increment of said input signal based on said sampling point density.

13. The measurement system of claim 10, wherein said response function is established as a frequency response, an amplitude response, a phase response or a transfer function.

14. The measurement system of claim 10, wherein said signal processing circuit is configured to determine at least one of an absolute value of said first derivative and an absolute value of said second derivative, and wherein said signal processing circuit is configured to determine said sampling point density based on at least one of said absolute value of said first derivative and said absolute value of said second derivative.

15. The measurement system of claim 10, wherein said signal processing circuit is configured to compare at least one of said first derivative and said second derivative with at least one predefined reference function in order to determine said sampling point density.

16. A measurement system for determining a response function of a device under test, said measurement system comprising an input and a signal processing circuit, said input being configured to receive an output signal of a device under test, said signal processing circuit being configured to:

at least one of receive a sampling point density or determine said sampling point density based on said output signal, and determine a response function of said device under test based on said output signal and based on said sampling point density, wherein said sampling point density represents a number of sampling points per frequency interval for determining said response function, and wherein said response function characterizes at least one property of said device under test as a function of frequency, wherein, in a first iteration, said signal processing circuit is configured to determine a preliminary response function based on a predefined preliminary sampling point density, and wherein said signal processing circuit is configured to adapt said preliminary sampling point density based on the determined preliminary response function, thereby obtaining said sampling point density, such that portions of the output signal are analyzed with a higher resolution in a second iteration of determining said response function of said device under test than in the first iteration of determining said preliminary response function.

* * * * *